United States Patent
Umeki

(10) Patent No.: US 7,413,609 B2
(45) Date of Patent: Aug. 19, 2008

(54) SEMICONDUCTOR SINGLE CRYSTAL MANUFACTURING APPARATUS

(75) Inventor: Toshirou Umeki, Kanagawa (JP)

(73) Assignee: Sumco Techxiv Corporation, Nagasaki (JP)

( * ) Notice: Subject to any disclaimer, the term of this patent is extended or adjusted under 35 U.S.C. 154(b) by 206 days.

(21) Appl. No.: 10/575,481

(22) PCT Filed: Oct. 13, 2004

(86) PCT No.: PCT/JP2004/015050

§ 371 (c)(1),
(2), (4) Date: Apr. 12, 2006

(87) PCT Pub. No.: WO2005/035839

PCT Pub. Date: Apr. 21, 2005

(65) Prior Publication Data

US 2007/0051303 A1    Mar. 8, 2007

(30) Foreign Application Priority Data

Oct. 14, 2003    (JP) .............................. 2003-353962

(51) Int. Cl.
*C30B 35/00* (2006.01)
(52) U.S. Cl. ................. 117/213; 117/217; 117/218; 117/222; 117/911
(58) Field of Classification Search .......... 117/208, 117/213, 214, 217, 218, 219, 222, 911
See application file for complete search history.

(56) References Cited

U.S. PATENT DOCUMENTS

| | | | | | |
|---|---|---|---|---|---|
| 5,106,593 | A | * | 4/1992 | Mizuishi et al. | 117/215 |
| 5,667,588 | A | * | 9/1997 | Iino et al. | 117/217 |
| 6,053,975 | A | * | 4/2000 | Iida et al. | 117/218 |
| 6,099,642 | A | * | 8/2000 | Kurosaka et al. | 117/218 |
| 6,183,556 | B1 | * | 2/2001 | Aydelott et al. | 117/218 |

FOREIGN PATENT DOCUMENTS

| | | | |
|---|---|---|---|
| JP | 59-28560 | | 2/1984 |
| JP | 08119790 A | * | 5/1996 |
| JP | 09-208382 | | 8/1997 |
| JP | 08-261903 | | 10/1997 |
| WO | WO00/40786 | | 7/2000 |

* cited by examiner

*Primary Examiner*—Felisa C Hiteshew
(74) *Attorney, Agent, or Firm*—Welsh & Katz, Ltd.

(57) ABSTRACT

A semiconductor single crystal manufacturing apparatus capable of lowering the local deterioration of a wire under high temperature atmosphere in the furnace of a chamber, wherein a crucible (24) in which silicon melt (28) is filled is installed in the furnace of the chamber (22), a pull-chamber (23) is disposed above the chamber (22), and a seed holder (32) lifting between the inside of the pull-chamber (23) and the inside of the furnace is suspended by a wire (50) through a coupling member (31). A collar (52) is fitted to the wire (50) so that, when the seed holder (32) is positioned to touch the melt, the exposed portion of the wire (50) near the tip thereof becomes a specified temperature or below under the high temperature atmosphere in the furnace.

8 Claims, 6 Drawing Sheets

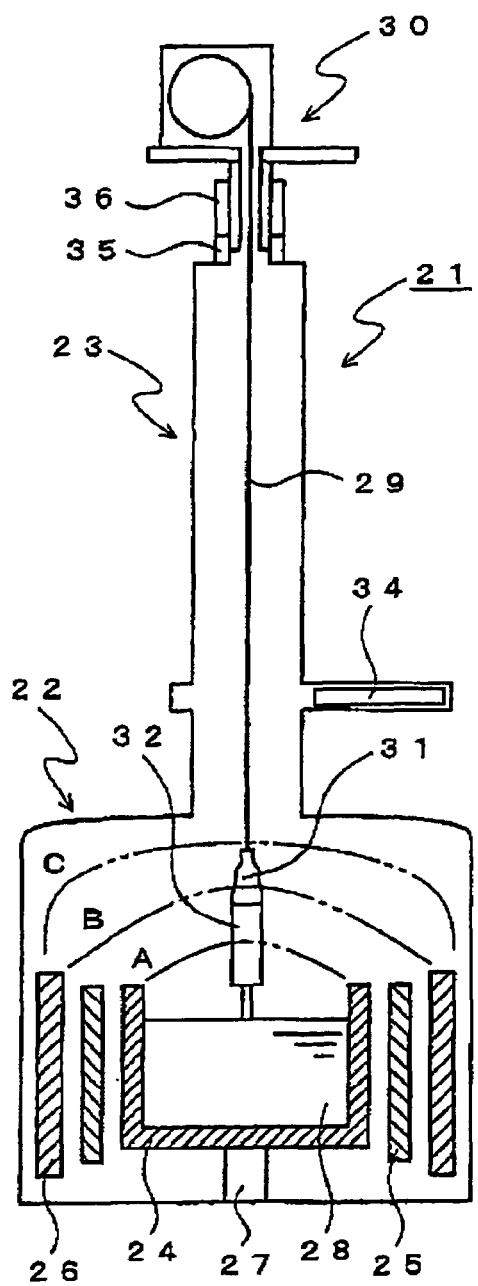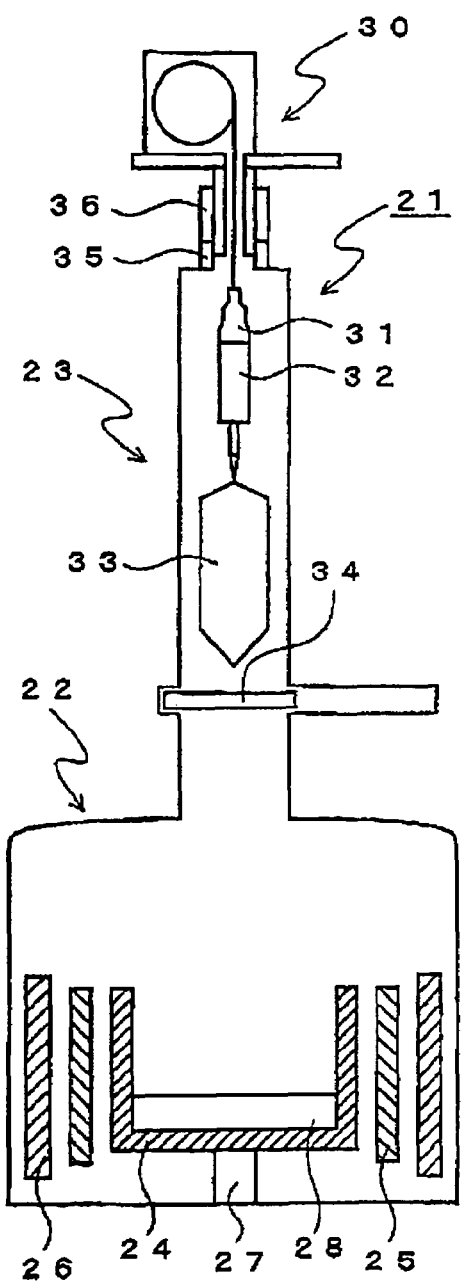
FIG. 4(A)
FIG. 4(B)

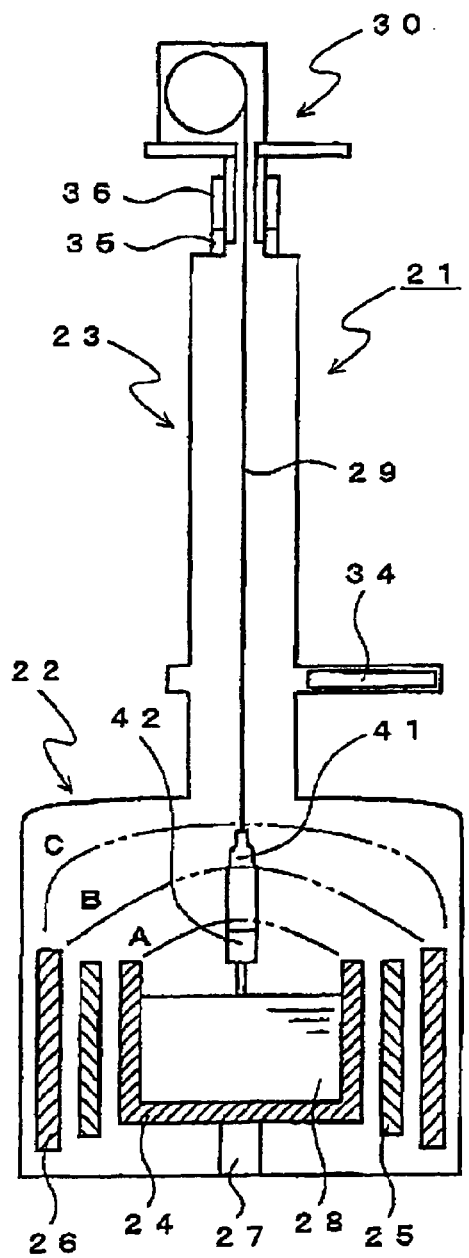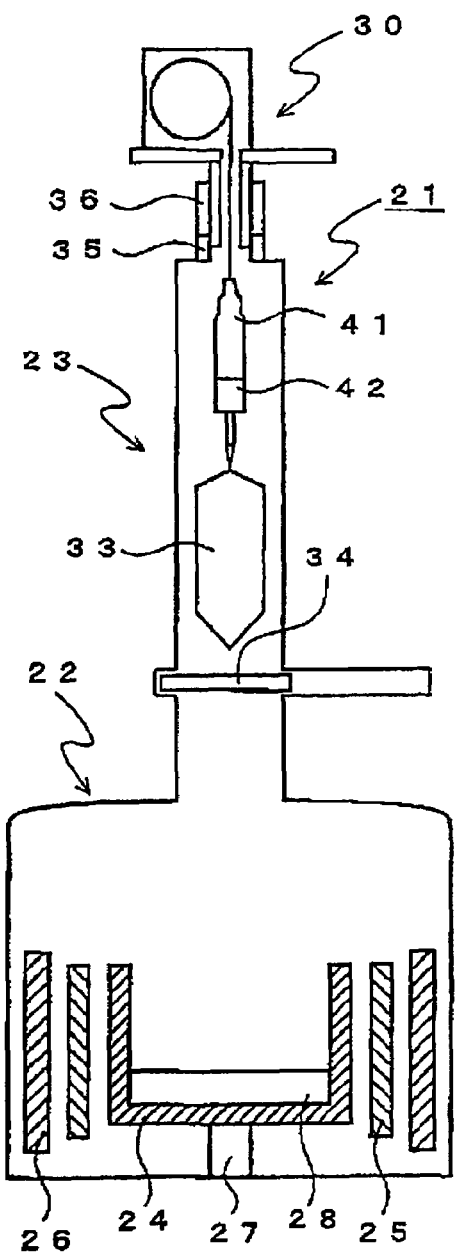
FIG. 5(A)
FIG. 5(B)

SEMICONDUCTOR SINGLE CRYSTAL MANUFACTURING APPARATUS

TECHNICAL FIELD

The present invention relates to a semiconductor single crystal manufacturing apparatus which grows a semiconductor ingot (e.g., semiconductor single crystal such as single crystal silicon or a compound semiconductor such as gallium arsenic).

BACKGROUND ART

Conventionally, for a substrate of a semiconductor device, semiconductor single crystal such as high purity single crystal silicon and compound semiconductors such as gallium arsenic have been used mainly. As one of the semiconductor producing methods, a CZ method (Czochralski method) which pulls up a cylindrical ingot from a material melt in a crucible is known.

The CZ method first charges a raw material in the crucible within a chamber of a semiconductor ingot manufacturing apparatus and melts the material by heating by a heater disposed around the crucible. Seed crystal attached to a seed holder is contacted to the melt, and the seed holder is pulled up while rotating the seed holder and the crucible in the same direction or opposite directions to grow a cylindrical ingot having a prescribed size. Then, the ingot is sliced to produce thin silicon wafers which are to be used for semiconductor integrated circuits and the like (e.g., see Patent Literature 1).

FIGS. 6(A) and 6(B) show a semiconductor ingot manufacturing apparatus according to the CZ method. FIG. 6(A) is an explanatory view of a state that the seed crystal attached to the seed holder is contacted to the melt, and FIG. 6(B) is an explanatory view of a state that the seed holder is pulled up to grow an ingot.

In FIGS. 6(A) and 6(B), a semiconductor ingot manufacturing apparatus 1 is provided with a bottom-closed cylindrical chamber 2 and a cylindrical pull chamber 3 which is erected from the top center of the chamber 2.

The chamber 2 has within its furnace a crucible 4 which is formed of quartz having a bottom-closed cylindrical shape with an open top and a rotation shaft 7 of which top end is fixed to the bottom of the crucible 4. The bottom end of the rotation shaft 7 is connected to a drive source (not shown) outside of the chamber 2, and it supports to allow the rotations of the crucible 4 within the chamber 2. A heater 5 which surrounds the crucible 4 is disposed around the crucible 4, and a heat insulating material 6 is disposed to surround the exterior of the heater 5 to prevent radiant heat of the heater 5 from being directly radiated to the inside wall of the chamber 2.

A winding device 10 for a wire 9 is disposed on the top of the pull chamber 3. A seed holder 12 is attached to the tip end of the wire 9 via a coupling member 11. The coupling member 11 hangs a hopper (not shown) for replenishing a raw material in charging and recharging steps and hangs the seed holder 12 to which the seed crystal is attached in a step of pulling up an ingot 13. A gate valve 14 for separating the interior of the pull chamber 3 into upper and lower sections is disposed close to the lower part of the pull chamber 3.

In the structure described above, the raw material is charged in the crucible 4 which is disposed within the chamber 2 and melted to prepare a silicon melt 8 by heating to melt the material by radiant heat of the heater 5 which is disposed to surround the crucible 4. Then, the seed crystal attached to the seed holder 12 is contacted to the silicon melt 8, and the ingot 13 is grown by pulling up the seed holder 12 by driving the winding device 10 while the seed holder 12 and the crucible 4 are rotated in the same direction or opposite directions.

Patent Literature 1:
Japanese Patent Application Laid-Open No. 8-261903

DISCLOSURE OF THE INVENTION

Problems to be Solved by the Invention

Generally, the wire 9 which is used to pull up an ingot is mainly formed of tungsten considering rotational deflection, heat resistance and the like of the seed crystal and the ingot 13. The tungsten starts to oxidize at about 400° C. when reacted with air. The tungsten also has a property that it forms high-class oxide WO3 at 700° C. and oxidizes rapidly.

Meanwhile, an atmosphere, in which the semiconductor ingot is pulled up, is mostly occupied by a substitution gas which is an inert gas and also contains a very small amount of oxide which is generated by a reaction between the silicon melt 8 and the quartz crucible 4. Thus, the atmosphere in which the semiconductor ingot is pulled up has a considerably small amount of oxygen in comparison with air, so that the tungsten wire 9 is substantially not oxidized at a temperature of about 400° C.

But, if the tungsten wire 9 is exposed to a high temperature of 700° C. or more, oxides from the silicon melt 8 react rapidly on the surface of the wire 9 to form tungsten oxide.

When the semiconductor ingot manufacturing apparatus configured as described above is in a state that the seed crystal is contacted to the silicon melt 8, namely in the state shown in FIG. 6(A), the inside of the furnace of the chamber 2 has an atmosphere with plural stages of different temperatures though variable depending on its volume and the like, for example, about 900° C. to 1000° C. in an area A just above the crucible 4, about 700° C. to 900° C. in an area B just above the area A, and about less than 700° C. in an area C just above the area B.

Especially, an in-furnace exposed portion of the wire 9 near the coupling member 11 tends to be exposed to a relatively high-temperature atmosphere of about 1000° C., and its surface is easily oxidized by a reaction with radiant heat from the heater 5 and oxide from the silicon melt 8. As a result, the mechanical strength of the wire 9 is locally deteriorated, and there is a disadvantage that it is necessary to exchange the wire as a whole even if the mechanical strength of the wire 9 is mostly sufficient.

The invention according to the present application has been made in order to remedy the above-described problems, and provides a semiconductor single crystal manufacturing apparatus which can decrease the local deterioration of the wire in an in-furnace high-temperature atmosphere of the chamber.

Means for Solving the Problem

In order to achieve the above objects, a first invention according to the present application is a semiconductor single crystal manufacturing apparatus, comprising a chamber disposed in a furnace and having a crucible in which a melt is charged, a heater for heating the crucible, and a wire disposed within the chamber, wherein at least a region of the wire which is exposed to a high temperature is covered with a collar.

A second invention according to the present application is the semiconductor single crystal manufacturing apparatus according to the first invention, wherein the collar is disposed in plural.

A third invention according to the present application is the semiconductor single crystal manufacturing apparatus according to the first or second invention, wherein the collar is disposed between a wire winding device and a seed crystal.

A fourth invention according to the present application is the semiconductor single crystal manufacturing apparatus according to any one of the first to third inventions, wherein the collar is disposed closely to cover the wire.

A fifth invention according to the present application is a semiconductor single crystal manufacturing apparatus, comprising a chamber disposed in a furnace and having a crucible in which a melt is charged, a pull chamber which is disposed above the chamber, a seed holder which is vertically moved between the inside of the pull chamber and the chamber, and a wire which hangs the seed holder via a coupling portion, wherein a length of at least either the seed holder or the coupling member is determined to be a length to locate an exposed portion of the wire near a tip end thereof in a region having a temperature less than a prescribed temperature in a high-temperature atmosphere within the furnace when a seed crystal is attached to the seed holder and located at a position to come into contact with the melt.

A sixth invention according to the present application is the semiconductor single crystal manufacturing apparatus according to the fifth invention, wherein less than the prescribed temperature is less than 700° C.

EFFECTS OF THE INVENTION

The semiconductor single crystal manufacturing apparatus of the invention is provided with a chamber having a crucible, in which a melt is charged, disposed in a furnace, a heater for heating the crucible, and a wire which is disposed within the chamber, wherein at least a region of the wire which is exposed to a high temperature is covered with a collar, so that direct radiant heat to the wire and a reaction with oxide can be prevented, and local deterioration of the wire can be decreased.

Besides, the semiconductor single crystal manufacturing apparatus of the present invention is provided with plural collars, so that working accuracy can be assured in the production of the collars, and deformation due to a thermal influence at the time of pulling up can be suppressed from affecting on eccentric accuracy originally possessed by the wire at the time of the rotations of the crystal. And, the adjustment of the wire's exposed position depending on the temperature range becomes possible, and the control of the wire oxidation rate can be controlled.

And, the semiconductor single crystal manufacturing apparatus of the invention has a length of at least either of the seed holder or the coupling member determined so that, when the seed crystal which is attached to the seed holder is at a position to come into contact with the melt, the exposed portion of the wire at the proximity of its tip end is positioned in a range of less than a prescribed temperature in a high-temperature atmosphere within the furnace. Therefore, even if the seed holder is at the melt-contacting position, the wire's exposed portion is located out of the high-temperature atmosphere in the furnace of the chamber, so that the wire can be decreased from being deteriorated locally.

Thus, according to the present invention, a highly durable semiconductor single crystal manufacturing apparatus can be provided by growing the single crystal silicon in a state that the exposed portion of the wire near its tip end keeps a prescribed temperature or less in the high-temperature atmosphere within the furnace when the seed holder is at a position in contact with the melt.

BRIEF DESCRIPTION OF THE DRAWINGS

FIGS. 4(A) and 4(B) show Example 2 of the semiconductor ingot manufacturing apparatus of the present invention, wherein 4(A) is an explanatory view of the semiconductor ingot manufacturing apparatus with the seed holder at the melt-contacting position, and 4(B) is an explanatory view of the semiconductor ingot manufacturing apparatus with the seed holder at a top end position.

FIGS. 5(A) and 5(B) show Example 3 of the semiconductor ingot manufacturing apparatus of the present invention, wherein 5(A) is an explanatory view of the semiconductor ingot manufacturing apparatus with the seed holder at the melt-contacting position, and 5(B) is an explanatory view of the semiconductor ingot manufacturing apparatus with the seed holder at a top end position.

DESCRIPTION OF REFERENCE NUMERALS

Figure 1A:
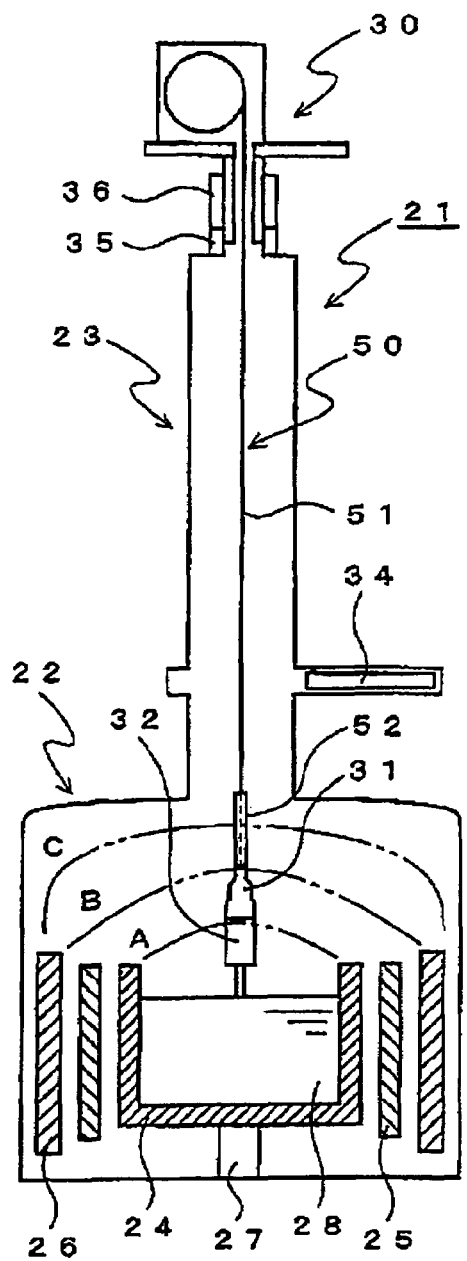
FIGS. 1(A) and 1(B) show Example 1 of a semiconductor ingot manufacturing apparatus of the present invention, wherein 1(A) is an explanatory view of the semiconductor ingot manufacturing apparatus with a seed holder at a melt-contacting position, and 1(B) is an explanatory view of the semiconductor ingot manufacturing apparatus with the seed holder at a top end position.

1 . . . Semiconductor ingot manufacturing apparatus
2 . . . Chamber
3 . . . Pull chamber
4 . . . Crucible
5 . . . Heater
6 . . . Heat insulating material
7 . . . Rotation shaft
8 . . . Silicon melt
9 . . . Wire
10 . . . Winding device
11 . . . Coupling member
12 . . . Seed holder
13 . . . Ingot
14 . . . Gate valve
21 . . . Semiconductor ingot manufacturing apparatus
22 . . . Chamber
23 . . . Pull chamber
24 . . . Crucible
25 . . . Heater
26 . . . Heat insulating material
27 . . . Rotation shaft
28 . . . Silicon melt
29 . . . Wire
30 . . . Winding device
31 . . . Coupling member 31a . . . Insertion portion
32 . . . Seed holder
33 . . . Ingot
34 . . . Gate valve
35 . . . Seal part
36 . . . Rotation transmission part
41 . . . Coupling member
42 . . . Seed holder
50 . . . Wire
51 . . . Wire body
52 . . . Collar
52a . . . Projection
52b . . . Recess
53 . . . Coupling portion
54 . . . Coupling portion
54a . . . Caulking portion

BEST MODE FOR CARRYING OUT THE INVENTION

The semiconductor single crystal manufacturing apparatus of the invention will be described with reference to the drawings.

EXAMPLE 1

Figure 1B:
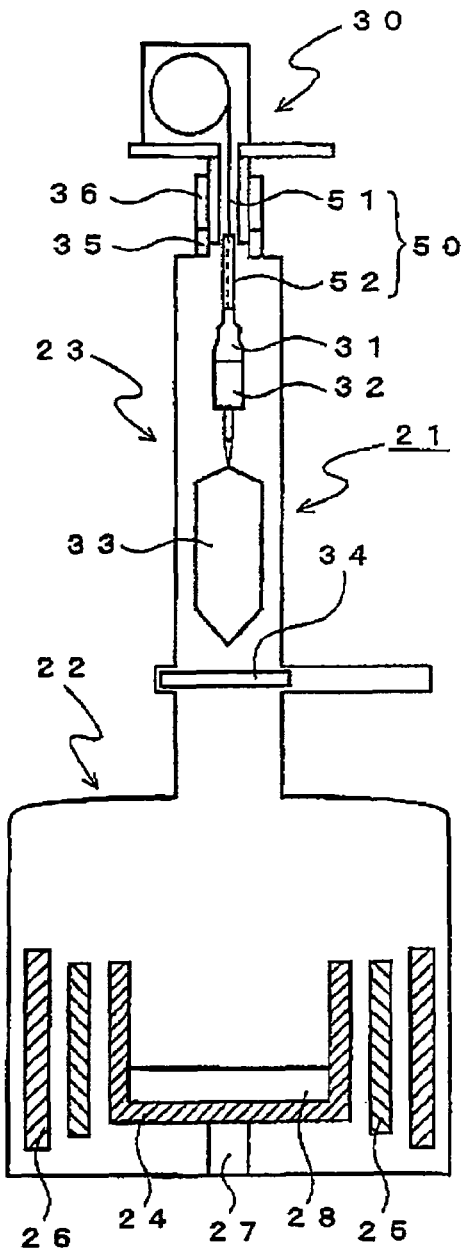
Figure 2A:
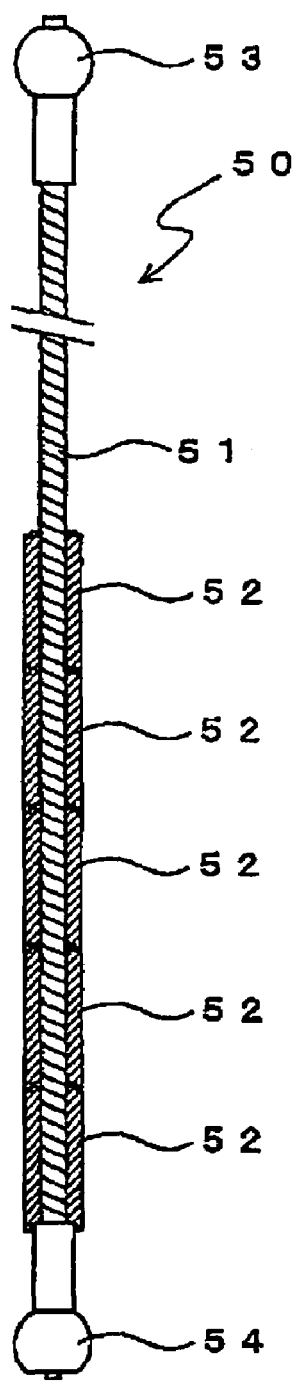
FIGS. 2(A) and 2(B) show Example 1 of the semiconductor ingot manufacturing apparatus of the present invention, wherein 2(A) is a sectional view of a wire, and 2(B) is an enlarged sectional view of a main portion showing a relation between a wire body and a collar.
Figure 2B:
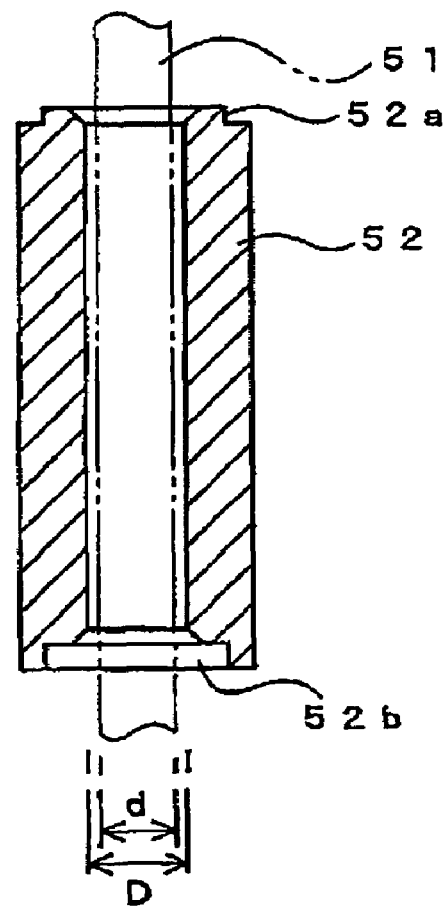
Figure 3:
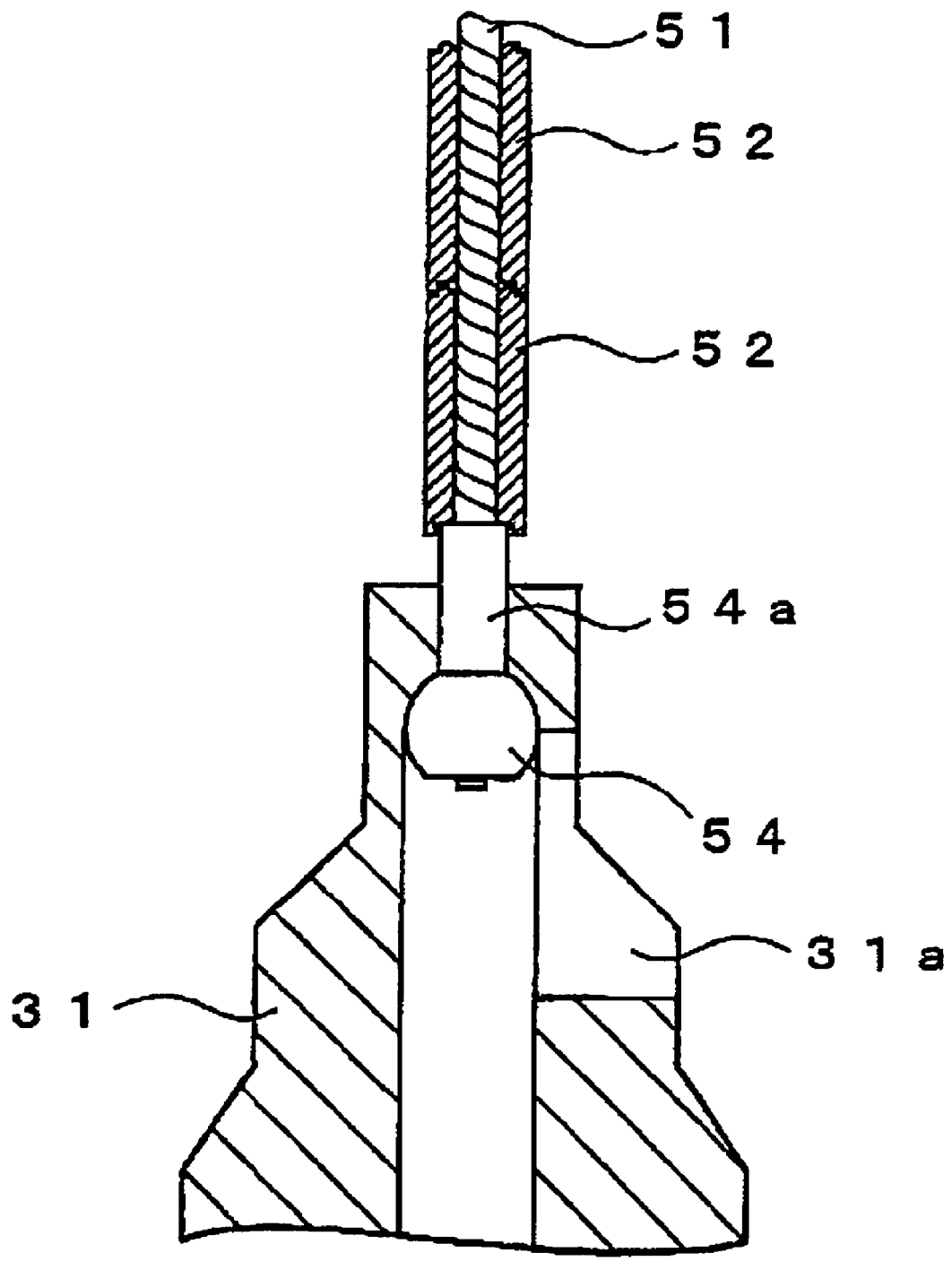
FIG. 3 shows Example 1 of the semiconductor ingot manufacturing apparatus of the present invention, and it is an enlarged sectional view of the main portion showing a relation between the wire body and a coupling member.
Figure 6A:
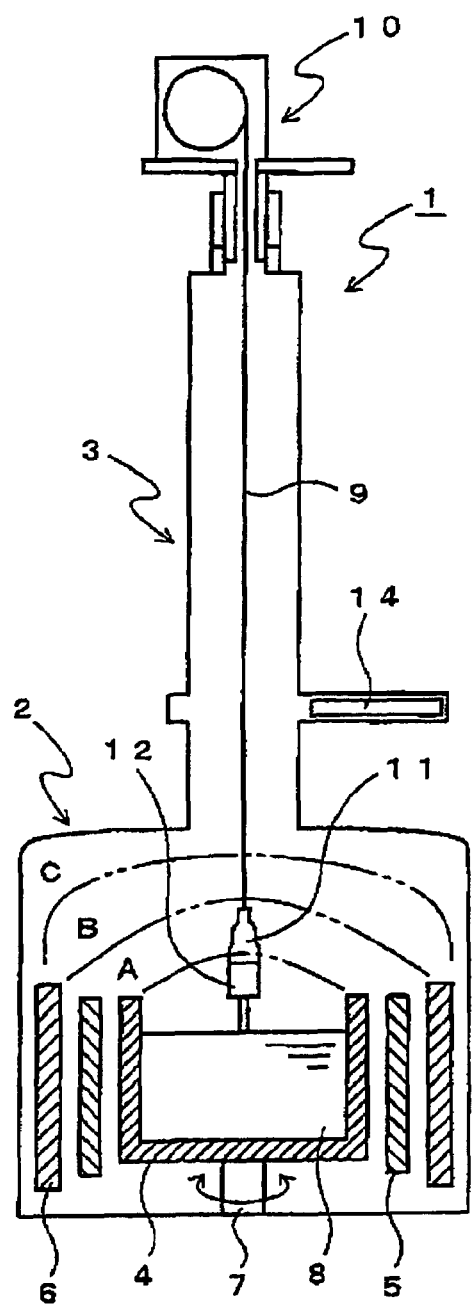
FIGS. 6(A) and 6(B) show a related art of the semiconductor ingot manufacturing apparatus, wherein 6(A) is an explanatory view of the semiconductor ingot manufacturing apparatus with the seed holder at a melt-contacting position, and 6(B) is an explanatory view of the semiconductor ingot manufacturing apparatus with the seed holder at a top end position.
Figure 6B:
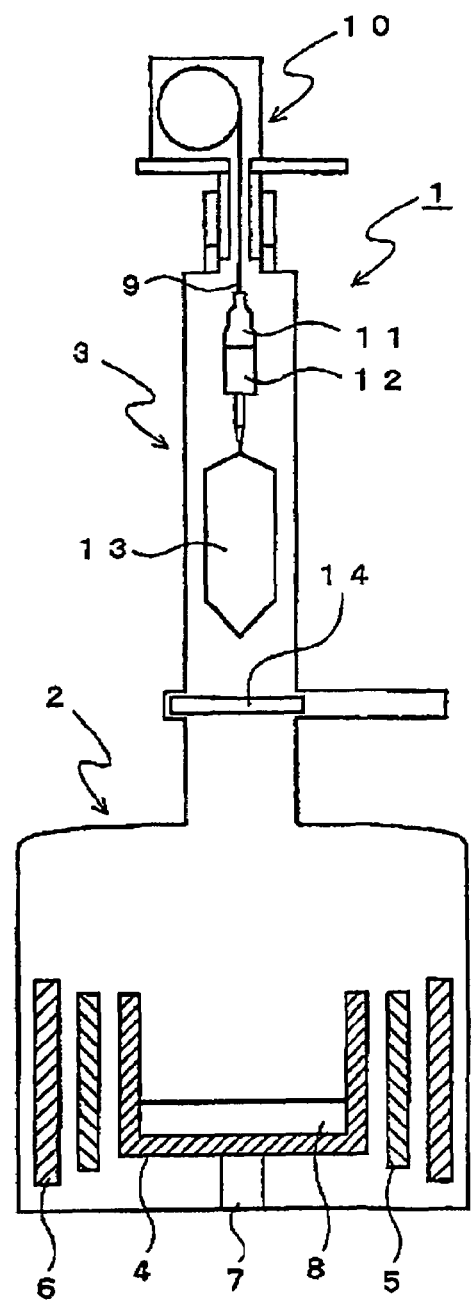

FIGS. 1(A) and 1(B) through FIG. 3 show Example 1 of the semiconductor ingot manufacturing apparatus of the invention. FIG. 1(A) is an explanatory view of the semiconductor ingot manufacturing apparatus with the seed holder at a melt-contacting position. FIG. 1(B) is an explanatory view of the semiconductor ingot manufacturing apparatus with the seed holder located at a top end. FIG. 2(A) is a sectional view of a wire, FIG. 2(B) is an enlarged sectional view of a main portion showing a relation between a wire body and a collar, and FIG. 3 is an enlarged sectional view of a main portion showing a relation between the wire body and the coupling member.

In FIGS. 1(A) and 1(B), a semiconductor ingot manufacturing apparatus 21 is provided with a bottom-closed cylindrical chamber 22 and a cylindrical pull chamber 23 which is erected from the top center of the chamber 22.

The chamber 22 has within its furnace a crucible 24 which is formed of bottom-closed cylindrical quartz having an open top and a rotation shaft 27 of which top end is fixed to the bottom of the crucible 24. The bottom end of the rotation shaft 27 is connected to a drive source (not shown) outside of the chamber 22, and it supports the crucible 24 to allow its rotations within the chamber 2. A heater 25 which surrounds the crucible 24 is disposed around the crucible 24, and a heat insulating material 26 is disposed to surround the exterior of the heater 25 to prevent radiant heat of the heater 5 from being directly radiated to the inside wall of the chamber 22.

Meanwhile, a winding device 30 for a wire 29 is disposed on the top of the pull chamber 23. A seed holder 32 is attached to the tip end of the wire 29 via a coupling member 31. The coupling member 31 hangs a hopper (not shown) for replenishing a raw material in charging and recharging steps and also hangs the seed holder 32, to which the seed crystal is attached, in a step of pulling up an ingot 33.

A gate valve 34 for completely separating the interior of the pull chamber 23 into upper and lower sections is disposed close to a lower part of the pull chamber 23. The inside of the pull chamber 23 and the inside of the chamber 22 form a continuous airtight space, but the melt can be kept in the chamber 22 by closing a gate valve 34 excepting when the ingot 33 is being pulled up, so that it becomes possible to open to the atmosphere by sealing a gas into the pull chamber 23 in that state, and it is also allowed to remove the pulled-up ingot 33 and to attach the hopper and the seed crystal.

The winding device 30 vertically moves the seed holder 32 which is attached to the leasing end of a wire 50 between a melt-contacting position (position shown in FIG. 1(A)) and a top end position (position shown in FIG. 1(B)). The melt-contacting position is a position where the seed crystal attached to the tip end of the seed holder 32 comes into contact with the surface of the silicon melt 28, and the top end position is a position where the grown ingot 33 is fully pulled up.

The wire 50 is provided with a wire body 51 and plural collars 52 which are disposed on the wire body 51. The wire body 51 is a cable having a wire rod, which is formed of tungsten or the like, stranded considering rotational deflection, heat resistance and the like of the seed crystal and the ingot 13.

As shown in FIG. 2(A), coupling portions 53, 54 which are coupled with the winding device 30 and the coupling member 31 are disposed on individual ends of the wire body 51 by mating according to a ball joint method. Thus, for example, the coupling member 31 is formed an insertion portion 31a used for mating the coupling portion 54 as shown in FIG. 3.

The coupling portion 54 is attached to the wire body 51 by caulking a stainless steel caulking portion 54a. Only the caulking portion 54a comes into contact with the coupling member 31, and the wire body 51 is not in direct contact with the coupling member 31, so that the wire body 51 can be prevented from wearing. Because the wire body 51 is not exposed into the coupling member 31, the wire body 51 is not exposed to an atmosphere gas which penetrates into the coupling member 31 through the insertion portion 31a. Thus, the wire body can be prevented from being undergone oxidative consumption, and the degradation of the wire can be decreased.

The collar 52 is formed of stainless steel, molybdenum, tungsten or the like into a cylindrical shape, and as shown in FIG. 2(B), and a projection 52a and a recess 52b are formed on either end of the collar 52 as male and female engaging portions for coupling without a gap between the vertically neighboring collars 52. Thus, the collars divided into the plural portions are provided with the different male and female engaging portions, so that the occurrence of a gap between the vertically adjacent collars can be prevented, and penetration of radiant heat or oxide through a gap between the collars can be prevented.

And, the collar 52 is determined to have an inner diameter D which is larger than a diameter d of the wire body 51.

A difference between the inner diameter D and the diameter d allows the diameter of the wire body 51 from partly swelling in a case where its core material (not shown) is cut off or the strand of the wire rod is untwisted due to deterioration with age of the wire body 51.

Thus, the inner diameter of the collar is larger than the diameter of the wire, so that where a wire has a core and the core wire is in a somewhat broken state even if its surrounding wire is not damaged, the diameter of the surrounding wire becomes large within the range of the inner diameter of the collar, and by vertically moving the collar, swelling can be detected according to its frictional force, and the wire can be prevented from breaking completely.

For example, at a time of periodic check or the exchange of the hopper and the seed crystal, the collar 52 is moved along the axis line of the wire body 51, and if the wire body 51 is not swelled, the collar 52 is moved smoothly, but if the wire body 51 is swelled, the movement of the collar 52 is disturbed, so that it is easy to check the degradation of the wire body 51. It is needless to say that breaking or deformation of the wire body 51 can be checked visually because the collar 52 is vertically movable.

The external diameter of the collar 52 is desired to have a size to allow its passage through the space of the winding portion so that the collar does not become an obstacle even if the ingot 33 to be pulled up has a long crystal length.

By configuring as described above, the wire 50, to which the hopper having a raw material therein is attached, is lowered to drop the raw material into the crucible 24. After charging the raw material, the hopper is raised, the pull chamber 23 is vertically separated (actually, the furnace interior of the chamber 22 and the interior of the pull chamber 23 are separated) by the gate valve 34. In this state, gas is sealed into the pull chamber 23 to make it possible to open to the atmosphere, and after the hopper is removed from the coupling member 31, the seed holder 32, to which a seed crystal is newly attached, is attached to the coupling member 31.

Then, the gate valve 34 is opened to contact the seed crystal to the surface of the silicon melt 28 in the crucible 24, the wire 50 is wound up by the winding device 30 while rotating the crucible 24 (the wire 50 may be rotated in the same direction or the opposite direction at the same time) to pull up the seed holder 32, thereby growing the single crystal ingot 33.

In this case, when the seed holder 32 is at the melt-contacting position as shown in FIG. 1(A), local degradation of the wire 50 due to radiant heat from the heater 24 or a reaction with oxide from the silicon melt 28 can be decreased because the tip end of the wire body 51 is covered for a prescribed range with the collar 52. More specifically, it is determined that the tip end of the wire body 51 which is covered with the collar 52 becomes less than 700° C. when it is at the melt-contacting position.

And, when the seed holder 32 is at the melt-contacting position, the length of the collar 52 is adjusted, so that a portion of the wire body 51 exposed from the collar 52, especially a portion which is near the collar 52 and exposed from the collar 52, is located within the area C ranging from the boundary having a furnace temperature of about 700° C. between the area B and the area C. More specifically, the length of the collar 52 is determined so that the exposed portion of the wire body 51 becomes less than 700° C. when the seed holder 32 is at the melt-contacting position.

Thus, the range of the wire body 51 covered with the collar 52 is determined to correspond to the range of the high-temperature atmosphere considering the in-furnace height of the chamber 22, so that the degradation of the wire body 51 involved in the oxidation can be decreased by using the existing coupling member 31 and the seed holder 32 without changing the design of the apparatus body.

Especially, the oxidation of the wire can be delayed and the local degradation of the wire can be decreased by keeping the wire at less than 700° C. which is a temperature that the reaction with oxide starts vigorously.

The wire which is used to pull up the ingot was described in the above Example, but it should be noted that the concept of the collar of the present invention can also be applied to any wire which is used in the chamber in the same way, and the present invention is not limited to the pull up of the ingot.

EXAMPLE 2

FIGS. 4(A) and 4(B) show Example 2 of the semiconductor ingot manufacturing apparatus of the present invention, FIG. 4(A) is an explanatory view of the semiconductor ingot manufacturing apparatus with the seed holder in a melt-contacting position, and FIG. 4(B) is an explanatory view of the semiconductor ingot manufacturing apparatus with the seed holder at the top position.

The semiconductor ingot manufacturing apparatus 21 of Example 2 shown in FIGS. 4(A) and 4(B) is only different in the coupling member attached to the tip end of the wire and the seed holder attached to the coupling member from Example 1 described above, so that the like reference numerals as those of FIGS. 1(A) and 1(B) of Example 1 are allotted to the other component members and their descriptions are omitted.

The seed holder 32 is formed of carbon or the like, and its length is determined so that when it is at the melt-contacting position, the exposed portion of the wire 29 at the proximity of its tip end is located at an upper part within the furnace of the chamber 22, namely in the area C ranging from the proximity of the boundary between the area B and the area C in at least the high-temperature atmosphere in the furnace. More specifically, the length is determined so that the wire's exposed portion in the proximity of the tip end of the wire 29 is less than 700° C. when the seed holder 32 is at the melt-contacting position.

At the time of pulling up for recharging, the seed holder 32 is determined to be longest so that, when the ingot 33 is pulled up to locate at the top end position, the bottom end of the ingot 33 is located above the gate valve 34. At this time, it is desirable that a design change (a height change, an increase in diameter of a seal part 35 as well as a rotation transmission part 36) of the pull chamber 23 is not made.

By configuring as described above, the wire 29, to which the hopper having a raw material therein is attached, is lowered to drop the raw material into the crucible 24. After the raw material is charged, the hopper is raised, and the pull chamber 23 is vertically separated by the gate valve 34. After the hopper is removed from the coupling member 31, the seed holder 32, to which a seed crystal is newly attached, is attached to the coupling member 31.

The raw material in the crucible 24 is melted by the heater 25, the gate valve 34 is opened, and the wire 29 is lowered to a melt-contacting position to contact the seed crystal to the surface of the silicon melt 28 in the crucible 24. The wire 29 is wound up by the winding device 30 while the crucible 24 is rotated (the wire 29 may be rotated in the same direction or the opposite direction at the same time) to pull up the seed holder 32, thereby growing the single crystal ingot 33.

As shown in FIG. 4(A), when the seed holder 32 is at the melt-contacting position, the wire's exposed portion in the proximity of the leasing end of the wire 29, namely the portion which is near the coupling member 31 and exposed from the coupling member 31, is located in the area C ranging from the proximity of the boundary having a furnace temperature of about 700° C. between the area B and the area C, so that local degradation of the wire 29 due to radiant heat from the heater 25 or a reaction with oxide from the silicon melt 28 can be decreased.

Especially, the oxidation of the wire can be delayed and the local degradation of the wire can be decreased by locating the exposed part of the wire's tip end in an atmosphere at a temperature of less than 700° C. at which the reaction of tungsten with oxide starts vigorously.

EXAMPLE 3

FIGS. 5(A) and 5(B) show Example 3 of the semiconductor ingot manufacturing apparatus of the present invention, FIG. 5(A) is an explanatory view of the semiconductor ingot manufacturing apparatus having the seed holder at a melt-contacting position, and FIG. 5(B) is an explanatory view of the semiconductor ingot manufacturing apparatus having the seed holder at a top end position.

The semiconductor ingot manufacturing apparatus 21 of Example 3 shown in FIGS. 5(A) and 5(B) is only different in the coupling member attached to the tip end of the wire 29 and the seed holder attached to the coupling member from Example 1 described above, so that the like reference numerals as those of FIGS. 1(A) and 1(B) of Example 1 are allotted to the other component members and their descriptions are omitted.

A coupling member 41 is detachably attached to the wire 29 and detachably holds a seed holder 42. When the seed holder 42 is at the melt-contacting position, the coupling member 41 is determined to have a length so that the tip end of the wire 29 is located at an upper part in the furnace of the chamber 22, namely located in the area C ranging from the proximity of the boundary between the area B and the area C in at least an in-furnace high-temperature atmosphere. More specifically, the length is determined so that the wire's exposed portion in the proximity of the tip end of the wire 29 is less than 700° C. when the seed holder 32 is at the melt-contacting position.

The coupling member 41 is determined to be longest so that, when the ingot 33 is pulled up to locate at the top end position, the bottom end of the ingot 33 is located above the gate valve 34. At this time, it is desirable that a design change (a height change, an increase in diameter of the seal part 35 as well as the rotation transmission part 36) of the pull chamber 23 is not made.

In the above structure, the gate valve 34 is also opened, and the seed crystal is contacted to the surface of the silicon melt 28 in the crucible 24. The wire 29 is wound up by the winding device 30 while the crucible 24 is rotated (the wire 29 may be rotated in the same direction or the opposite direction at the same time) to pull up the seed holder 42, thereby growing the single crystal ingot 33.

As shown in FIG. 5(A), when the seed holder 42 is at the melt-contacting position, the wire's exposed portion in the proximity of the leasing end of the wire 29, namely the portion which is near the coupling member 41 and exposed from the coupling member 41, is located in the area C ranging from the proximity of the boundary having a furnace temperature of about 700° C. between the area B and the area C, so that local degradation of the wire 29 due to radiant heat from the heater 25 or a reaction with oxide from the silicon melt 28 can be decreased.

Especially, the oxidation of the wire can be delayed and the local degradation of the wire can be decreased by locating the exposed part of the wire's tip end in an atmosphere at a temperature of less than 700° C. that the reaction of tungsten with oxide starts vigorously.

In Example 2 or 3 described above, the structure described in Example 1 may also be used at the same time. And, the coupling member is used to connect the wire and the seed holder in Examples 1 through 3 described above, but the coupling member of the present application is not required to be a member independent of the seed holder but also includes a portion which is a part of the seed holder and serves to connect to the wire.

INDUSTRIAL APPLICABILITY

The provision of the collar on the region of the wire which is exposed to a high temperature is not limited to the wire which is used to pull up the ingot shown in Example 1, but it can also be applied to any wire which is disposed in the furnace and used for any purpose.

The production of the single crystal ingot was described as examples in the descriptions of Examples 1 through 3 above, but the present invention can also be applied to a compound semiconductor ingot and other ingots other than the single crystal ingot.

The invention claimed is:

1. A semiconductor single crystal manufacturing apparatus, comprising a chamber disposed in a furnace and having a crucible in which a melt is charged, a heater for heating the crucible, and a wire exposed to the melt disposed within the chamber, wherein:
   at least a portion of the wire which is exposed to a high temperature is covered with a collar.

2. The semiconductor single crystal manufacturing apparatus according to claim 1, further including a plurality of collars to cover at least a portion of the wire.

3. The semiconductor single crystal manufacturing apparatus according to claim 1 or 2, wherein collar is disposed between a wire winding device and a seed crystal.

4. The semiconductor single crystal manufacturing apparatus according to claim 3, wherein the collar is disposed closely to cover the wire.

5. The semiconductor single crystal manufacturing apparatus according to claim 2, wherein the plurality of collars are disposed closely to cover the wire.

6. The semiconductor single crystal manufacturing apparatus according to claim 1, wherein the collar is disposed closely to cover the wire.

7. The semiconductor single crystal manufacturing apparatus according to claim 1, wherein the wire having a portion covered with the collar hangs a seed holder which is vertically moved within the chamber, via a coupling member, and a length of at least either of the seed holder or the coupling member is determined to be a length to locate a proximity of a tip end of the exposed region of the wire in a region having a temperature less than a prescribed temperature in a high-temperature atmosphere within the furnace when the seed crystal is attached to the seed holder and located to come into contact with the melt.

8. The semiconductor single crystal manufacturing apparatus according to claim 7, wherein less than the prescribed temperature is less than 700° C.

* * * * *

UNITED STATES PATENT AND TRADEMARK OFFICE
CERTIFICATE OF CORRECTION

| | | |
|---|---|---|
| PATENT NO. | : 7,413,609 B2 | Page 1 of 1 |
| APPLICATION NO. | : 10/575481 | |
| DATED | : August 19, 2008 | |
| INVENTOR(S) | : Toshirou Umeki | |

It is certified that error appears in the above-identified patent and that said Letters Patent is hereby corrected as shown below:

Column 10, Line 23, cancel the text beginning with "1. A semiconductor" and ending "with a collar" and insert the following claim:

--A semiconductor single crystal manufacturing apparatus, comprising a chamber disposed in a furnace and having a crucible in which a melt is charged, a heater for heating the crucible, and a wire within the chamber, wherein: at least a region of the wire, which is exposed to a high temperature by radiant heat from a heater that heats the crucible, is covered with a collar.--

Signed and Sealed this

Seventh Day of October, 2008

JON W. DUDAS
*Director of the United States Patent and Trademark Office*